(12) United States Patent
Ramaswamy et al.

(10) Patent No.: US 9,029,256 B2
(45) Date of Patent: *May 12, 2015

(54) CHARGE-TRAP BASED MEMORY

(75) Inventors: Nirmal Ramaswamy, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 44 days.

This patent is subject to a terminal disclaimer.

(21) Appl. No.: 13/598,258

(22) Filed: Aug. 29, 2012

(65) Prior Publication Data

US 2012/0319172 A1 Dec. 20, 2012

Related U.S. Application Data

(63) Continuation of application No. 12/548,193, filed on Aug. 26, 2009, now Pat. No. 8,258,034.

(51) Int. Cl.
*H01L 29/788* (2006.01)
*H01L 27/088* (2006.01)
*H01L 21/28* (2006.01)
*H01L 27/115* (2006.01)
*H01L 29/66* (2006.01)
*H01L 29/792* (2006.01)

(52) U.S. Cl.
CPC .... *H01L 21/28282* (2013.01); *H01L 27/11578* (2013.01); *H01L 27/11582* (2013.01); *H01L 29/66833* (2013.01); *H01L 29/792* (2013.01); *H01L 29/7926* (2013.01)

(58) Field of Classification Search
CPC ..................... H01L 27/11807; H01L 27/0207; H01L 27/1104; H01L 27/11; H01L 27/11521; H01L 27/115; H01L 21/823807; H01L 21/28273; H01L 29/66825; H01L 29/7883

USPC ................. 257/205, E21.209, E29.3, E27.06; 438/594

See application file for complete search history.

(56) References Cited

U.S. PATENT DOCUMENTS 7,303,956 B2 * 12/2007 Harari ........................... 438/257
8,258,034 B2 * 9/2012 Ramaswamy et al. ........ 438/287
(Continued)

FOREIGN PATENT DOCUMENTS

CN 1855511 A 11/2006
CN 101847602 A 9/2010
(Continued)

OTHER PUBLICATIONS

"International Application Serial No. PCT/US2010/046672, International Preliminary Report on Patentability mailed Mar. 8, 2012", 6 pgs.

(Continued)

*Primary Examiner* — Monica D Harrison
(74) *Attorney, Agent, or Firm* — Schwegman Lundberg & Woessner, P.A.

(57) ABSTRACT

Methods of fabricating 3D charge-trap memory cells are described, along with apparatus and systems that include them. In a planar stack formed by alternate layers of electrically conductive and insulating material, a substantially vertical opening may be formed. Inside the vertical opening a substantially vertical structure may be formed that comprises a first layer, a charge-trap layer, a tunneling oxide layer, and an epitaxial silicon portion. Additional embodiments are also described.

19 Claims, 8 Drawing Sheets

(56) References Cited

U.S. PATENT DOCUMENTS

| | | |
|---|---|---|
| 2002/0097621 A1 | 7/2002 | Fujiwara |
| 2008/0173928 A1* | 7/2008 | Arai et al. .................. 257/316 |
| 2009/0090965 A1* | 4/2009 | Kito et al. .................. 257/326 |
| 2009/0108333 A1* | 4/2009 | Kito et al. .................. 257/324 |
| 2010/0006922 A1* | 1/2010 | Matsuoka et al. ............ 257/324 |
| 2011/0049606 A1 | 3/2011 | Ramaswamy et al. |

FOREIGN PATENT DOCUMENTS

| | | |
|---|---|---|
| JP | 2007317874 A | 12/2007 |
| JP | 2009105090 A | 5/2009 |
| KR | 100771553 B1 | 10/2007 |
| KR | 100829607 B1 | 4/2008 |
| KR | 1020080029534 A | 4/2008 |
| KR | 20090104218 A | 10/2009 |
| WO | WO-2011028581 A2 | 3/2011 |

OTHER PUBLICATIONS

"International Application Serial No. PCT/US2010/046672, Search Report mailed Feb. 28, 2011", 3 pgs.

"International Application Serial No. PCT/US2010/046672, Written Opinion mailed Feb. 28, 2011", 4 pgs.

"Chinese Application Serial No. 201080042884.7, Office Action mailed Mar. 26, 2013", 9 pgs.

"Chinese Application Serial No. 201080042884.7, Office Action mailed Oct. 10, 2013", 5 pgs.

"Chinese Application Serial No. 201080042884.7, Response filed Dec. 23, 2013 to Office Action mailed Oct. 10, 2013", 11 pgs.

* cited by examiner

CHARGE-TRAP BASED MEMORY

PRIORITY APPLICATION

This application is a continuation of U.S. application Ser. No. 12/548,193, filed Aug. 26, 2009, now U.S. Pat. No. 8,258,034 which is incorporated herein by reference in its entirety.

BACKGROUND

Non-volatile semiconductor memories (NVSMs) are widely used in many electronic devices such as personal digital assistants (PDAs), laptop computers, mobile phones, digital cameras, and so on. Some of these memories operate on the basis of charge trapping.

BRIEF DESCRIPTION OF THE DRAWINGS

Some embodiments are illustrated by way of example and not limitation in the figures of the accompanying drawings in which.

DETAILED DESCRIPTION

Figure 1:
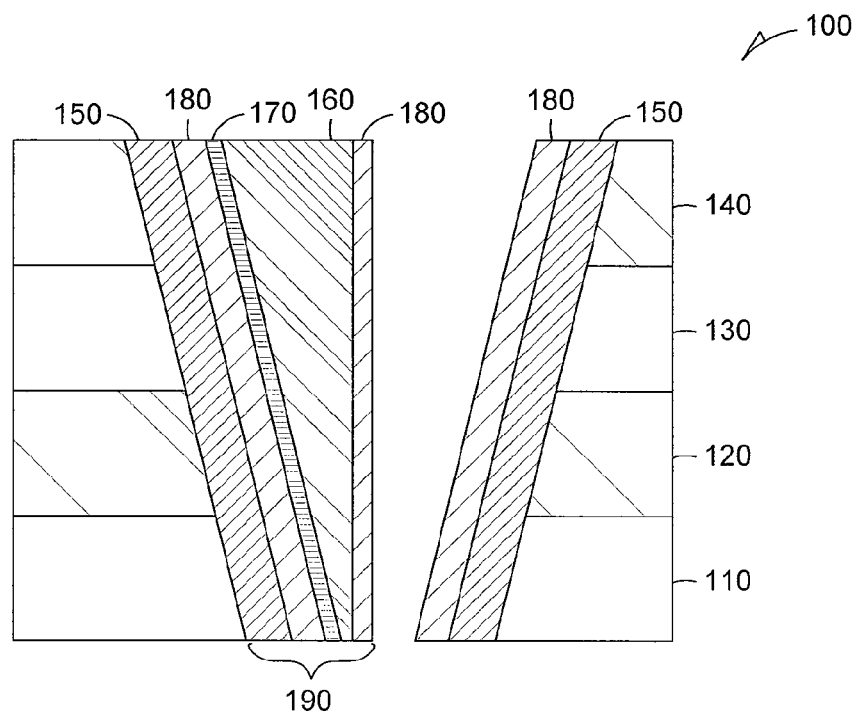
FIG. 1 is a cross sectional view of a portion of a charge-trap based memory cell, according to various embodiments of the invention.

Embodiments of example structures and methods of fabricating a 3D charge-trap based memory cell will now be described. In the following description, for purposes of explanation, numerous examples having example-specific details are set forth to provide a thorough understanding of example embodiments. It will be evident, however, to one skilled in the art that the present examples may be practiced without these example-specific details.

Example embodiments may include forming a substantially vertical opening (hereinafter "vertical opening") in a planar stack formed by alternate layers of electrically conductive and insulating material. While the term "vertical opening" is used throughout the remainder of this document, it should be noted that such is done only as a matter of convenience. Thus, the broader term "substantially vertical opening" can be used in place of the term "vertical opening" in every instance.

Inside the vertical opening a substantially vertical structure (hereinafter "vertical structure") including a first layer (e.g., a blocking dielectric layer), a charge-trap layer, a tunneling oxide layer, and an epitaxial silicon portion may be formed. While the term "vertical structure" is used throughout the remainder of this document, it should be noted that such is done only as a matter of convenience. Thus, the broader term "substantially vertical structure" can be used in place of the term "vertical structure" in every instance.

Similarly, instead of the term "electrically conductive material", the term "metal" is used throughout the remainder of this document as a matter of convenience. It should be noted that that the broader term "electrically conductive material" can be used in place of the term "metal" in every instance. Electrically conductive material may comprise any one or more of the following components, among others: NiSi, Ru, Si, TaN, Ti, TiN, TiSi, WN, and $WSi_x$.

Finally, instead of the term "insulating material", the term "oxide" is used throughout the remainder of this document as a matter of convenience. It should be noted that the broader term "insulating material" can be used in place of the term "oxide" in every instance. An insulating material may comprise any one or more of the following components, among others: $AlO_x$, $HfAlO_x$, $LaAlO_x$, $LaO_x$, SiN, $SiO_2$, $ZrAlO_x$ $ZrO_x$, and $ZrSiO_x$. In addition, an insulating material may include multiple layers of any one or more of these components.

Some layers that comprise these insulating materials, described in further detail below, may be described as blocking dielectric layers. These include layers having a a dielectric layer that includes an inter-poly dielectric (IPD). Some layers that comprise these insulating materials, described in further detail below, may be described as charge-trap layers, such as those that include atomic layer deposition (ALD) SiN. It should be noted that both blocking dielectric layers and charge trap layers may each comprise multiple layers of one or more of the insulating material components listed above, among others.

The vertical structure may comprise the dielectric layer, the epitaxial silicon portion partially covered by the tunneling oxide layer, and the charge-trap layer that covers an exposed vertical surface of the epitaxial silicon portion and the tunneling oxide layer. The charge-trap layer may fill a gap between the tunneling oxide layer and the dielectric layer. It should be noted that, as is the case with blocking dielectric layers and charge trap layers, the tunneling oxide layer may comprise multiple layers, and each of the layers in the tunneling oxide may comprise any one or more of the insulating materials listed above, among others:

This 3D structure may function as a NAND (not AND) charge-trap based (hereinafter "charge-trap") memory device. In a charge-trap memory device, instead of a floating gate, a charge-trap layer may be formed to store information by trapping charge carriers. The 3D structure comprises a metal-insulator-nitride-oxide-silicon (MINOS) memory device, which includes a gate electrode (e.g., metal layer 120 in FIG. 1), a blocking insulator layer (e.g., IPD layer 150 in FIG. 1), the nitride (e.g., silicon nitride) charge-trap layer (e.g., charge-trap layer 180 in FIG. 1), a tunneling oxide layer (e.g., tunneling oxide layer 170 in FIG. 1), and a silicon channel (e.g., epitaxial silicon 160 in FIG. 1).

The silicon nitride layer comprises a material layer in which data are stored. Charge carriers passing through the tunneling oxide layer by tunneling are trapped in the silicon nitride layer. The IPD layer is formed on the silicon nitride layer as a blocking insulating layer for preventing charge carriers trapped in the silicon nitride layer from escaping the silicon nitride layer.

Figure 3:
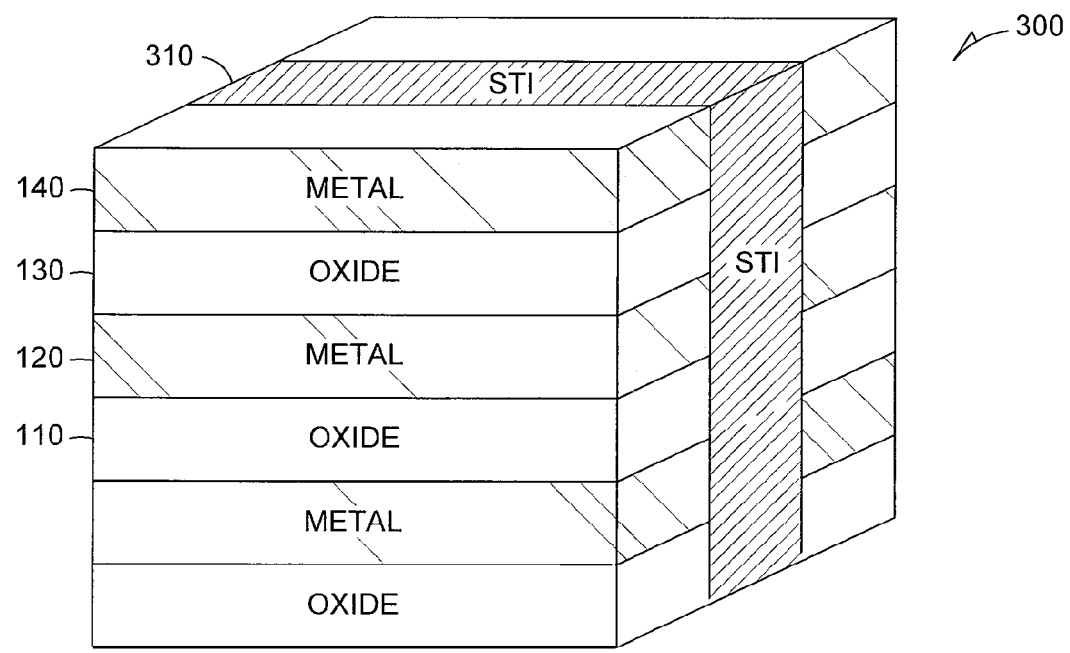
FIG. 3 is a three-dimensional (3D) view illustrating a stack of alternate layers of electrically conductive and insulating materials, in which the charge-trap based memory cell of FIG. 1 can be formed, according to various embodiments of the invention.

FIG. 1 is a cross sectional view illustrating a portion of a charge-trap based memory cell 100, according to various embodiments of the invention. The charge-trap based memory cell 100 (hereinafter "charge-trap memory cell 100") is formed in the stack 300 of FIG. 3. A portion of the stack 300 shown in FIG. 1 includes metal layers 120 and 140 and oxide layers 110 and 130. It should be noted that while only four total layers of metal and oxide are shown in this figure, as well as in FIGS. 4-8, an actual memory device will have additional layers of metal and oxide. The number of layers has been artificially reduced in FIGS. 1 and 4-8 so that the structure of the layers can be easily seen, and the cell 100 fabrication process can be more easily understood. FIGS. 3 and 9, described below, represent a more practical implementation.

Inside an opening in the stack 300, the vertical structure 190 may be formed. The vertical structure 190 may comprise, a dielectric layer 150, an epitaxial silicon portion (hereinafter "silicon channel") 160, a tunneling oxide layer 170 and a charge-trap layer 180. In the memory cell 100, the metal layer 120 and the silicon channel 160 may respectively represent a gate and a channel of a NAND MINOS charge-trap device, in which charge carriers may be trapped in the charge-trap layer 180.

Figure 2:
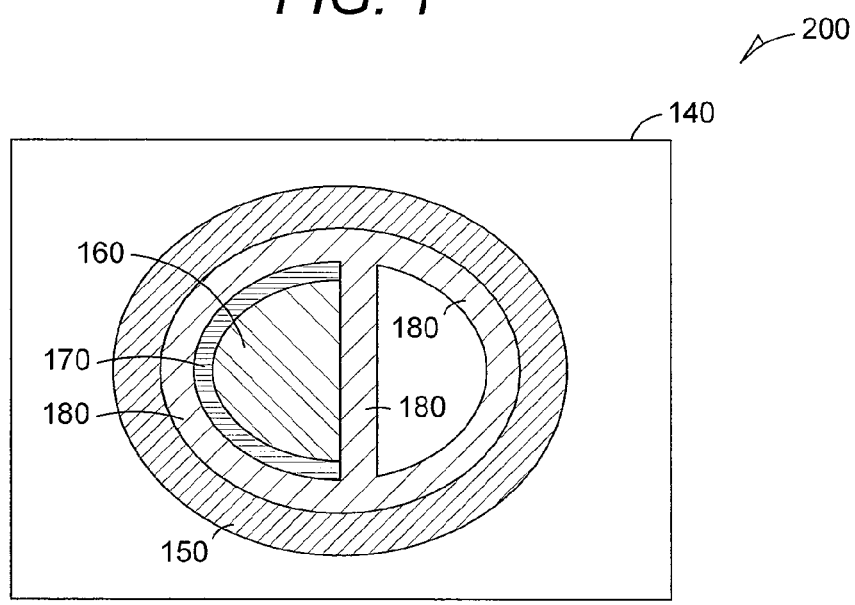
FIG. 2 is a top view illustrating a charge-trap based memory cell of FIG. 1, according to various embodiments of the invention.

FIG. 2 is a top view 200 illustrating a charge-trap memory cell 100 of FIG. 1, according to various embodiments of the invention. The top view 200 shows how the tunneling oxide layer 170, by substantially surrounding the silicon channel 160, allows the charge carriers passing through the silicon channel 160 to tunnel through the tunneling oxide layer 170 so as to be trapped in the charge-trap layer 180. Also the IPD layer 150, as shown in top view 200, substantially surrounds and isolates the charge-trap layer 180 from the metal 140 (also metal layer 120 of FIG. 1), to reduce or prevent the charge carriers from leaking into these metal layers. Various process activities involved in forming the above discussed layers will be described in FIGS. 3-8, discussed below.

FIG. 3 is a 3D view illustrating a stack 300 of alternate layers of electrically conductive and insulating materials, in which charge-trap based memory cells can be formed, according to various embodiments of the invention. The shallow trench isolation (STI) 310 may isolate portions of stack 300 where rows of memory cells of a 3D memory arrays may be formed. The memory cells of each row of the memory array may share a common gate contact (e.g., metal layer 120 or 140), which also operates as a word-line contact for the memory array. The oxide layers 110 and 130 insulate metal layers 120 and 140. While six layers of metal and oxide are shown in this figure and in FIG. 9, the total number of layers used in a particular application may vary greatly, from six (as shown) on up to a practically unlimited number. The top metal layer and the bottom metal layer create the select gate in many embodiments. The layers between the top and bottom metal layers form the strings.

Figure 4:
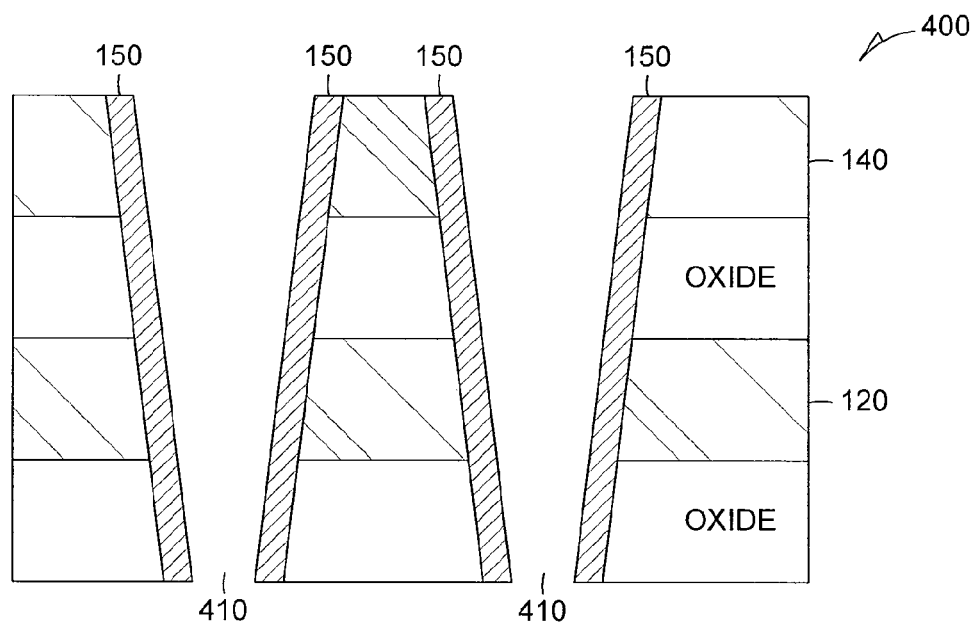
FIG. 4 is a cross sectional view illustrating an in-process stack of FIG. 3, after forming a first layer on the wall of a vertical opening, according to various embodiments of the invention.

FIG. 4 is a cross sectional view 400 illustrating an in-process stack of FIG. 3, after forming a first layer on the wall of a vertical opening, according to various embodiments of the invention. The process of formation of the charge-trap memory cell 100 of FIG. 1 may begin by forming a vertical opening 410 in the stack 300 of FIG. 3. The vertical openings 410 may be created by an etch process (e.g., wet etch or dry etch, and so on.) following formation of an etch mask that defines the horizontal position of the openings on the stack 300 of FIG. 3. The walls of the vertical opening 410 may turn out to be only approximately vertical due to limitations of the etch process. FIG. 4 shows two vertical openings 410 that can be used to form to vertical structures. The wall of the vertical openings 410 may be covered with an IPD layer 150. In FIGS. 4-8, only two openings 410 are shown, as part of an array of openings that will typically be much larger in an actual device. The number of openings 410 has been artificially reduced so that the structure of the layers can be easily seen, and the cell fabrication process can be more easily understood.

Deposition of the IPD layer may follow the formation of the vertical opening using the same mask layer as used for defining the horizontal position of the vertical opening. The IPD layer 150 may comprise an insulating material such as silicon dioxide, thermally grown, or deposited using, for example, low-pressure chemical vapor deposition (LPCVD) or plasma enhanced chemical vapor deposition (PECVD). The IPD layer 150 may comprise other insulating materials such an oxide-nitride-oxide (ONO) composite layer, which may be deposited using known methods. The IPD layer 150 may typically have a thickness range of about 10 nm to about 30 nm.

In example embodiments, the IPD layer 18 may comprise a high-k material such as, for example, any of the insulating materials listed above, perhaps deposited using an LPCVD technique or a rapid thermal chemical vapor deposition (RTCVD) process, among others. The IPD layer 150 comprising high-k materials may typically be deposited to a thickness of, for example, about 5 nm to about 30 nm. It is to be noted that the desired thickness is related to the actual k-value of the constituents of the IPD layer 150 and some parameters of the memory cell 100. The IPD layer may insulate the metal layers 120 and 140 from a remaining portion of the vertical structure 190 of FIG. 1, that will be formed in the remaining vertical opening 410 as discussed below.

Figure 5:
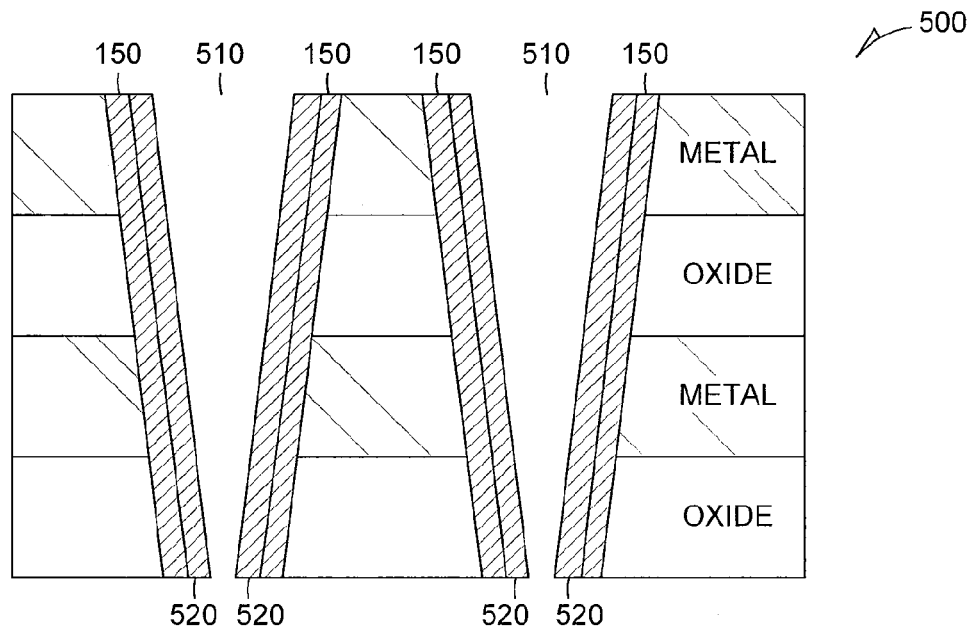
FIG. 5 is a cross sectional view illustrating an in-process stack of FIG. 4, after forming a second layer on the first layer, according to various embodiments of the invention.

FIG. 5 is a cross sectional view 500 illustrating an in-process stack of FIG. 4, after forming a second layer on the IPD layer 150, according to various embodiments of the invention. The second layer may comprise the sacrificial layer 520, also known by some of ordinary skill in the art as a "spacer layer". The sacrificial layer 520 may be formed by depositing a layer of dielectric material using conventional deposition methods such as CVD or physical vapor deposition (PVD) or ALD. The dielectric material may include a nitride such as silicon nitride (SiN) or silicon dioxide (SiO2). The sacrificial layer 520 may be deposited to a thickness ranging from about 1 nm to about 30 nm. The processing of the remaining vertical opening 510 will now be discussed. The sacrificial layer 520 may also be deposited at the bottom of the opening 510, but can be removed using a spacer etch.

Figure 6:
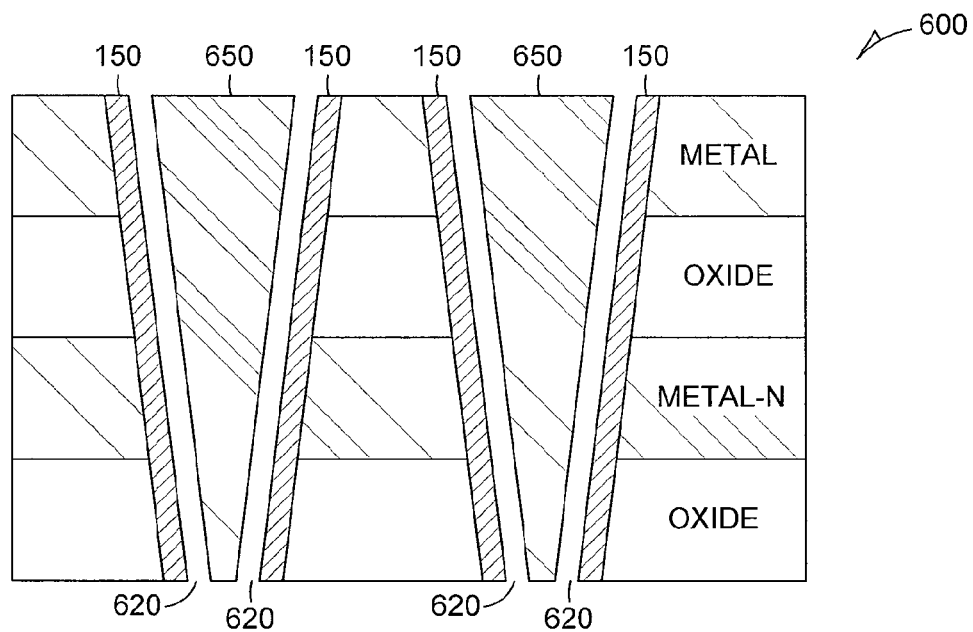
FIG. 6 is a cross sectional view illustrating an in-process stack of FIG. 5, after filling a remaining portion of the vertical opening with epitaxial silicon and removing the sacrificial layer, according to various embodiments of the invention.

FIG. 6 is a cross sectional view 600 illustrating an in-process stack of FIG. 5, after filling remaining portion of the vertical opening with epitaxial silicon and removing the sacrificial layer, according to various embodiments of the invention. At this stage of the process of forming the charge-trap memory cell 100 of FIG. 1, as shown in FIG. 6, the remaining vertical opening 510 of FIG. 5 may be filled by epitaxial silicon material 650. The formation of the epitaxial silicon material 650 may be performed by processes known to those of ordinary skill in the art. In some embodiments, the epitaxial silicon material 650 may be replaced by other forms of silicon material, such as poly-silicon.

After filing the remaining vertical opening with epitaxial silicon material 650, or other substitute silicon material, the sacrificial layer 520 of FIG. 5 may be removed. The removal of the sacrificial layer 520 may be performed by known etch processes, such as wet etch processes. The solvent used in the wet etch process depends on the material used for the sacrificial layer 520. The removal of the sacrificial layer 520 may create an opening 620 between the IPD layer 150 and the epitaxial silicon 160, thus exposing sides of the epitaxial silicon material 650 for further processing as discussed now with respect to FIG. 7.

Figure 7:
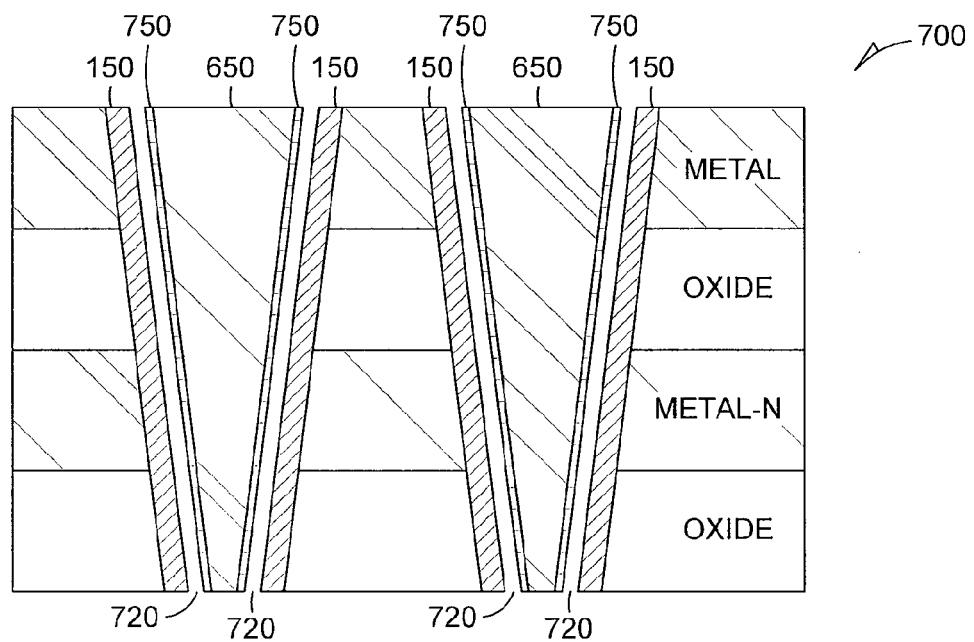
FIG. 7 is a cross sectional view illustrating an in-process stack of FIG. 6, after forming a tunneling oxide layer, according to various embodiments of the invention.

FIG. 7 is a cross sectional view 700 illustrating an in-process stack of FIG. 6, after forming a tunneling oxide layer, according to various embodiments of the invention. The tunneling oxide layer 750 may be formed on the epitaxial silicon material 650 by thermal oxidation of the exposed areas of the epitaxial silicon material 650 located in the opening 620. The thermal oxidation of epitaxial silicon is a well known process and may include, for example, exposing desired areas of epitaxial silicon material 650 to dry oxygen or nitrogen oxide under known conditions. Following the formation of the tunneling oxide layer 750, an opening 720 remains between the tunneling oxide layer 750 and the IPD layer 150, that can be processed as described in FIG. 8.

Figure 8:
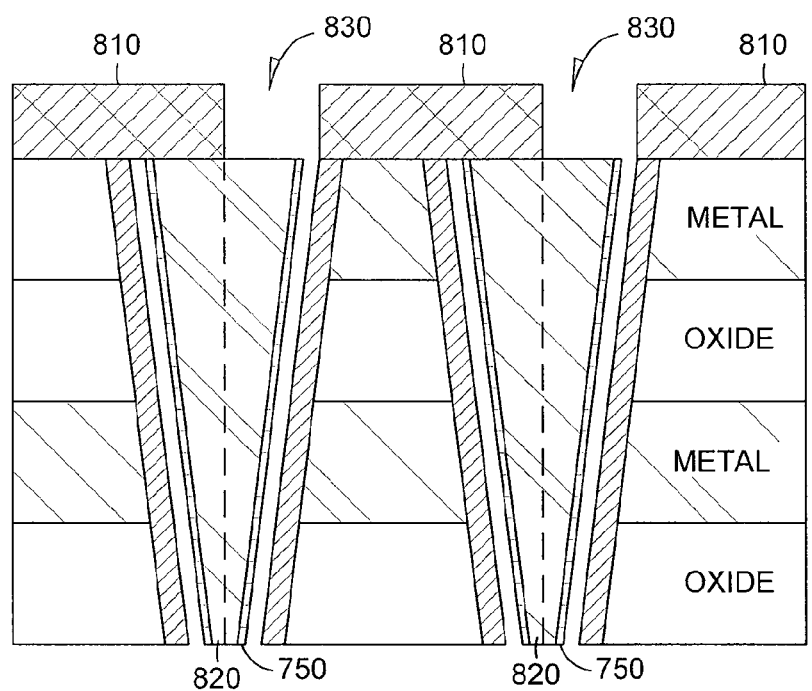
FIG. 8 is a cross sectional view illustrating an in-process stack of FIG. 7, after forming a mask for removal of portions of epitaxial silicon, according to various embodiments of the invention.
Figure 9:
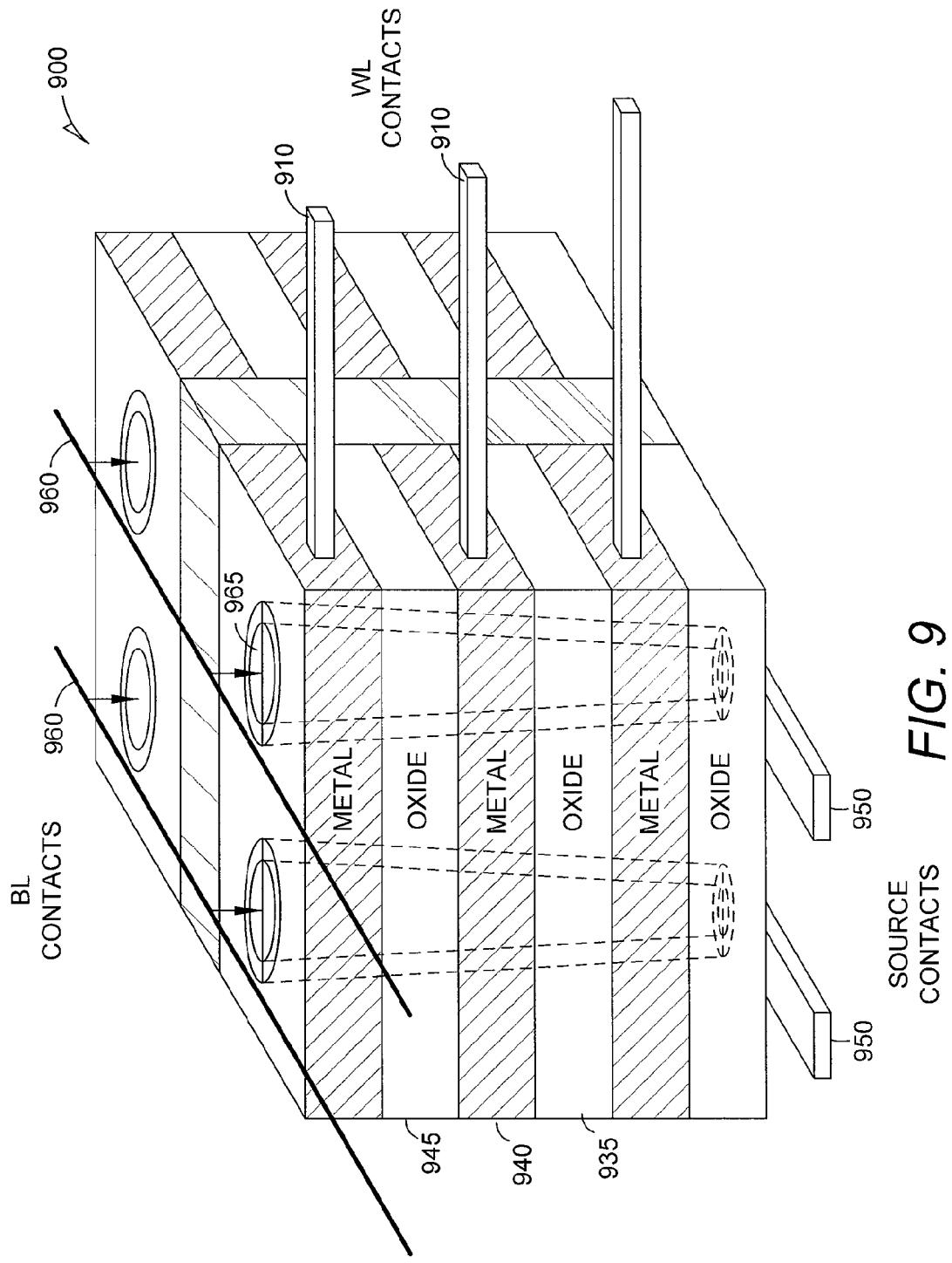
FIG. 9 is a 3D view illustrating the connection of various contacts used for programming the charge-trap based memory cell of FIG. 1, according to various embodiments of the invention.

FIG. 8 is a cross sectional view illustrating an in-process stack of FIG. 7, after forming a mask for removal of portions of epitaxial silicon, according to various embodiments of the invention. The objective of this processing is to form a charge-trap layer 180 shown in FIG. 2. However, in order to allow precursors to flow through the entire opening and substantially fill the opening 720 of FIG. 7, a portion of the epitaxial silicon material 650 of FIG. 7 can be removed. The patterned masks 810 may cover the top of the stack except for exposed areas 830 that allow etching the undesired portions 820 of the epitaxial silicon and portions of the tunneling oxide layer 750 that lies under the exposed areas 830.

Etching of the epitaxial silicon and tunneling oxide may be performed by known etch processes, such as using a dry etch, or combination of dry and wet etch schemes. After completing the etch process, the remaining opening may be filled with charge-trap material to form the charge-trap layer 180 shown in FIGS. 1 and 2. The charge-trap layer 180 may be formed by known processes, such as by ALD, perhaps using silicon nitride (Si3N4), or CVD, PVD, and others.

FIG. 9 is a 3D view 900 illustrating the connection of various contacts used for programming the charge-trap memory cell 100 of FIG. 1, according to various embodiments of the invention. The contacts shown in FIG. 9 include word-line (WL) contacts 910, source contacts 950, and bit-line (BL) contacts 960. The source contacts 950 may be formed on a substrate (not shown). After the contacts 910, 950, 960 are connected to various signals known to those of ordinary skill in the art, electrons can be injected into the charge trap layer formed between the oxide layers 935, 945 by tunneling from the substrate, placing a high field on the control gates (e.g., when a positive voltage is applied to a word line coupled to one of the WL contacts 910). These electrons are stored in the trap sites of the charge trap layer (e.g., the charge trap layer 180 of FIG. 1) and alter the threshold voltage Vt of the device. The data represented by the trapped electrons can be erased by tunneling the electrons back into the substrate, or by tunneling holes into the charge trap layer (e.g., by placing a negative voltage on the word line coupled to one of the WL contacts 910).

Figure 10:
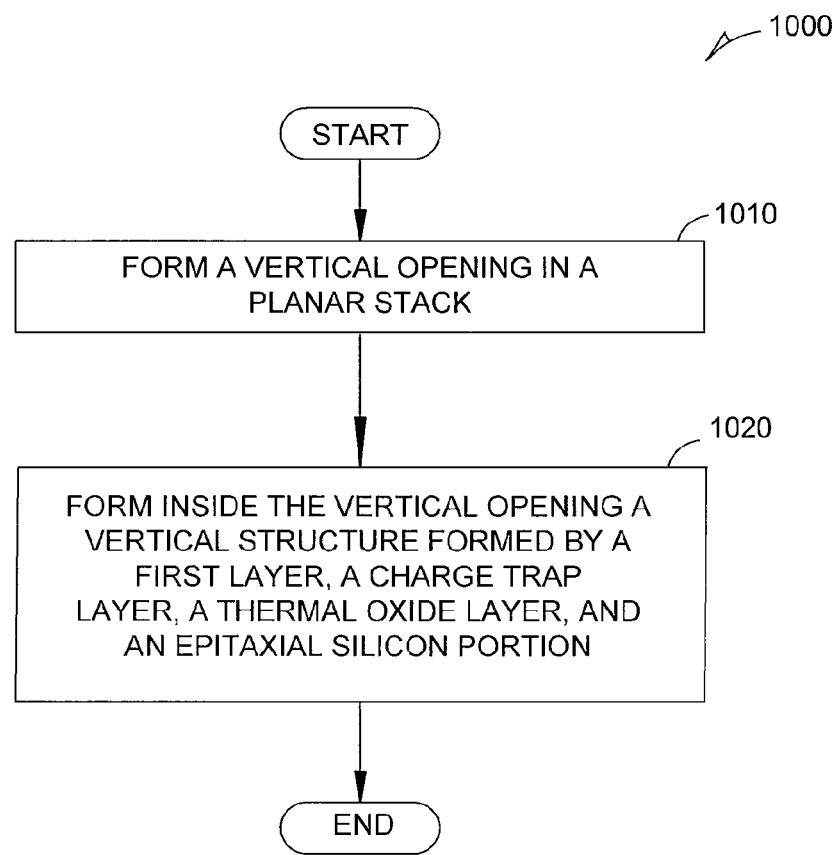
FIG. 10 is a flow diagram illustrating a method of forming the charge-trap based memory cell of FIG. 1, according to various embodiments of the invention.

FIG. 10 is a high-level flow diagram illustrating a method 1000 for forming the charge-trap memory cell 100 of FIG. 1, according to various embodiments of the invention. At operation 1010, a vertical opening may be formed in the stack 300 of FIG. 3. At operation 1020, as described above with respect to FIGS. 4-8, a vertical structure 190 of FIG. 1 including the first layer (e.g., the IPD layer 150 of FIG. 4), the charge-trap layer 180, the tunneling oxide layer 170, and the epitaxial silicon portion 160, as shown in FIG. 1, is formed.

Figure 11:
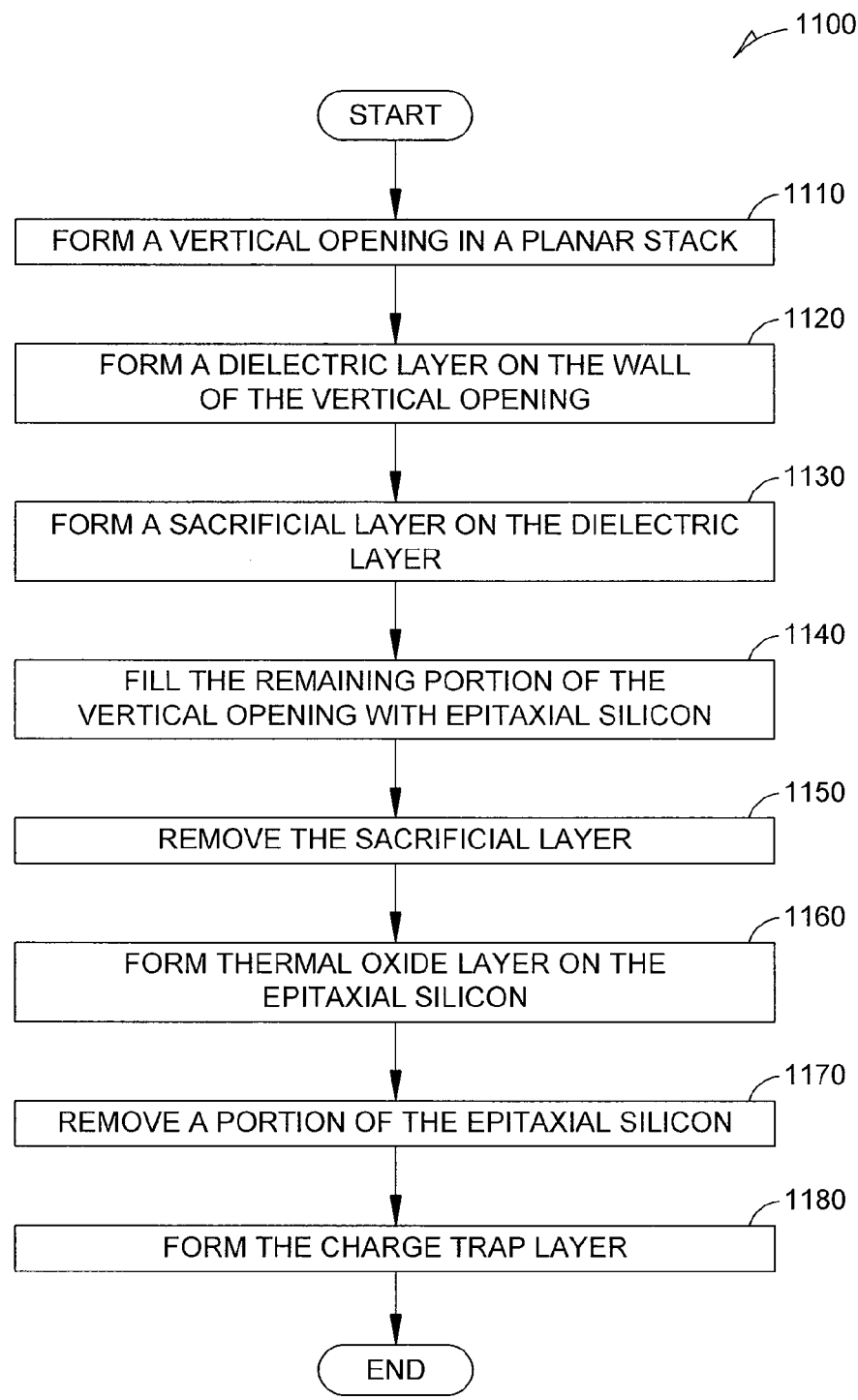
FIG. 11 is a flow diagram illustrating a method of forming the charge-trap based memory cell of FIG. 1, according to various embodiments of the invention.

FIG. 11 is a flow diagram illustrating a method 1100 for forming the charge-trap memory cell 100 of FIG. 1, according to various embodiments of the invention. At operation 1110, a vertical opening may be formed in the stack 300 of FIG. 3. At operation 1120, a first layer (e.g., a blocking dielectric layer such as the IPD layer 150 of FIG. 4) may be formed on the wall of the vertical opening, as described above with respect to FIG. 4. At operation 1130, a sacrificial layer 520 of FIG. 5 may be formed on the IPD layer 150 (for details, see the description of FIG. 5, above).

The method 1100 may go on to include the activity of operation 1140, which involves filling the remaining vertical opening 510 of FIG. 5 with epitaxial silicon material 650 of FIG. 6 (for details, see the description of FIG. 6, above). At operation 1150, the sacrificial layer 520 may be removed to leave an opening 620, as shown in FIG. 6 (for details, see the description of FIG. 6, above).

At operation 1160, as described above with respect to FIG. 7, the tunneling oxide layer 750 of FIG. 7 can be formed on the epitaxial silicon material 650 of FIG. 7. Portions of the epitaxial silicon material 650 of FIG. 6 may be removed, at operation 1170, to facilitate formation of the charge-trap layer (for details, see the description of FIG. 6). Finally, at operation 1180, the charge-trap layer 180 may be formed to fill the gap between the tunneling oxide layer 170 and the IPD layer 150, and to cover the exposed surfaces of the epitaxial silicon portion 160 and the IPD layer 150, which are located in the vertical opening.

In some embodiments, the operation 1120, which involves formation of the IPD layer 150, may be postponed to be performed after the operation 1180. In this embodiment, the charge-trap layer 180 will cover the tunneling oxide layer 170 and the exposed surface of the epitaxial silicon portion 160. A remaining gap between the charge-trap layer 180 and the wall of the vertical opening may be filled with IPD layer 150 using known processes.

Figure 12:
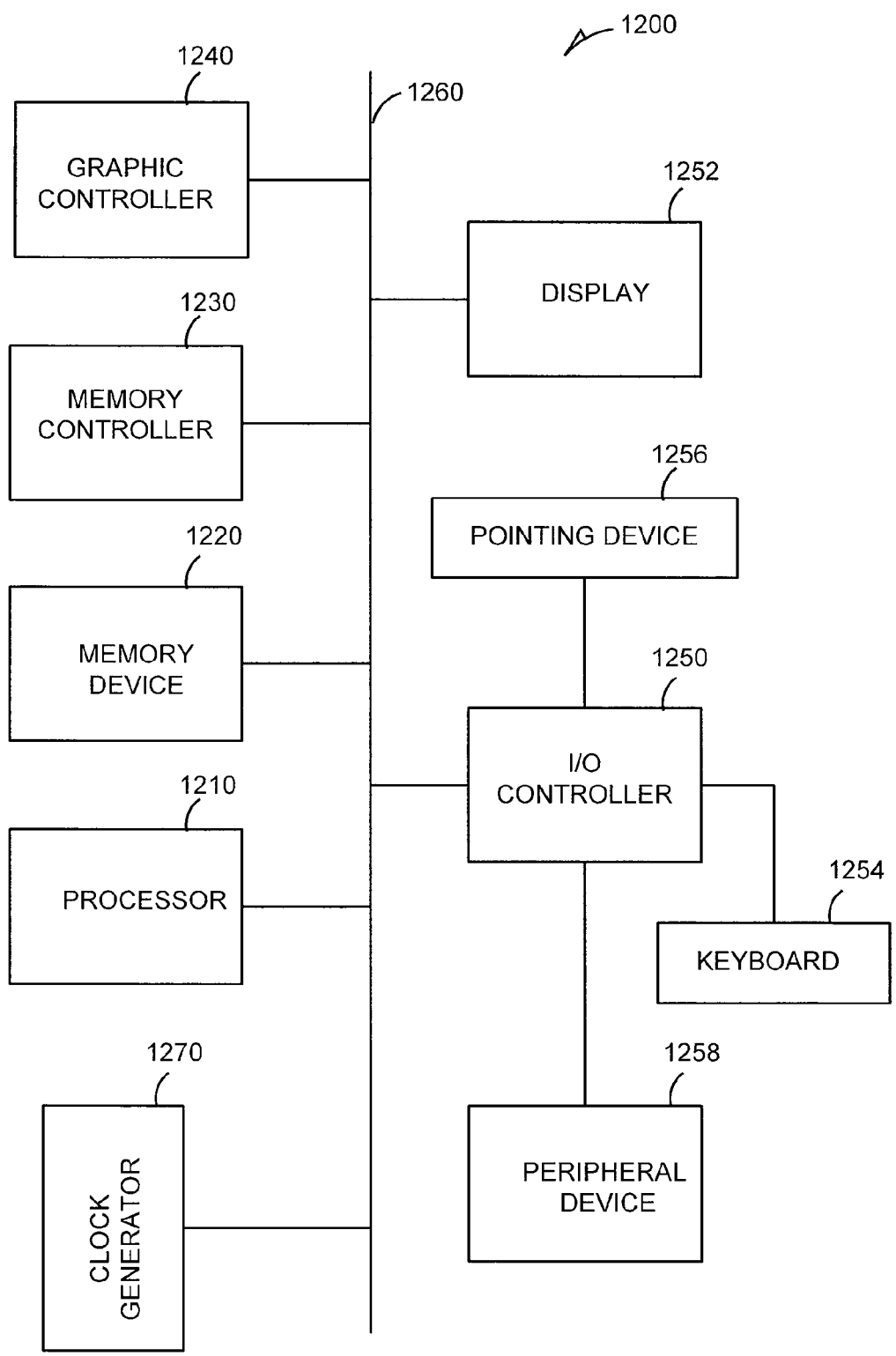
FIG. 12 is a diagram illustrating a system, according to various embodiments of the invention.

FIG. 12 is a diagram illustrating a system 1200, according to various embodiments of the invention. The system 1200 may include a processor 1210, a memory device 1220, a memory controller 1230, a graphic controller 1240, and an input and output (I/O) controller 1250, a display 1252, a keyboard 1254, a pointing device 1256, and a peripheral device 1258. A bus 1260 couples all of these devices together. A clock generator 1270 provides a clock signal to at least one of the devices of system 1200 via bus 1260. An example of clock generator 1270 may include an oscillator in a circuit board such as a motherboard. Two or more devices shown in system 1200 may be formed in a single chip.

Memory device 1220 may comprise a non-volatile memory including the charge-trap memory cell 100 of FIG. 1. Bus 1260 may be interconnect traces on a circuit board or may be one or more cables. Bus 1260 may also couple the devices of system 1200 by wireless means such as by electromagnetic radiations, for example, radio waves. Peripheral device 1258 may be a printer, an optical device such as a CD-ROM and a DVD reader and writer, a magnetic device reader and writer such as a floppy disk driver, or an audio device such as a microphone.

System 1200 represented by FIG. 12 may includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Example structures and methods of fabricating a 3D charge-trap memory cell have been described. Although specific embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that allows the reader to quickly ascertain the nature of the technical disclosure. It is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. A method of fabricating a charge-trap memory cell comprising:
    forming, in a substantially vertical opening, a substantially vertical structure including a charge-trap layer, a tunneling oxide layer, and an epitaxial silicon portion, wherein the forming of the substantially vertical structure comprises:
        filling part of a remaining portion of the substantially vertical opening with an epitaxial silicon material to form the epitaxial silicon portion, such that the charge-trap layer is in direct contact with a substantially vertical surface of the epitaxial silicon portion; and
        forming the tunneling oxide layer on the epitaxial silicon material.

2. The method of claim 1, wherein the substantially vertical opening is formed in a planar stack formed by alternate layers of electrically conductive and insulating materials.

3. The method of claim 2, wherein the electrically conductive material is selected from any one or more of NiSi, Ru, Si, TaN, Ti, TiN, TiSi, WN, and $WSi_x$, and wherein the insulating material is selected from any one or more of $AlO_x$, $HfAlO_x$, $LaAlO_x$, $LaO_x$, SiN, $SiO_2$, $ZrAlO_x$ $ZrO_x$, and $ZrSiO_x$.

4. The method of claim 2, wherein the planar stack is formed on a source contact formed on a substrate and electrically coupled to the epitaxial silicon portion.

5. The method of claim 2, wherein at least one of the layers of electrically conductive material comprises a word-line for the charge-trap memory cell.

6. The method of claim 1, further comprising forming a bit-line contact and electrically coupling the bit-line contact to the epitaxial silicon portion.

7. The method of claim 1, wherein the forming of the substantially vertical structure further comprises forming a dielectric layer including inter-poly dielectric (IPD).

8. The method of claim 1, wherein the forming of the substantially vertical structure further comprises forming atomic layer deposited (ALD) silicon nitride.

9. The method of claim 1, wherein the forming of the substantially vertical structure further comprises filling of the substantially vertical opening from a top of the substantially vertical opening, separated from a bottom of the substantially vertical opening, the bottom proximate to a substrate.

10. A charge-trap memory cell comprising:
    a substantially vertical structure including at least a dielectric layer, a charge-trap layer, a tunneling oxide layer, and an epitaxial silicon portion formed inside a substantially vertical opening created in a planar stack formed by alternate layers of electrically conductive and insulating material, wherein the charge-trap layer is in direct contact with a substantially vertical surface of the epitaxial silicon portion, the epitaxial silicon portion having a height extending from a top of the epitaxial silicon portion to a bottom of the epitaxial silicon portion, wherein the substantially vertical structure comprises the dielectric layer substantially covering a wall of the substantially vertical opening and the epitaxial silicon portion partially covered by the tunneling oxide layer and the charge-trap layer.

11. The charge-trap memory cell of claim 10, further comprising a bit-line contact electrically coupled to the epitaxial silicon portion.

12. The charge-trap memory cell of claim 10, further comprising a source contact formed beneath the planar stack and electrically coupled to the epitaxial silicon portion.

13. The charge-trap memory cell of claim 10, wherein at least one of the layers of electrically conductive material comprises a word-line for the charge-trap memory cell.

14. The charge-trap memory cell of claim 10, wherein the dielectric layer comprises an inter-poly dielectric (IPD) layer, and wherein the charge-trap layer comprises atomic layer deposited (ALD) silicon nitride.

15. The charge-trap memory cell of claim 10, wherein the substantially vertical structure fills a portion of the substantially vertical opening and further includes the charge-trap layer disposed between the tunneling oxide layer and the dielectric layer.

16. A memory comprising:
    a plurality of memory cells, each memory cell of the plurality of memory cells comprising a charge-trap memory cell, wherein the charge-trap memory cell comprises:
    a substantially vertical structure including at least a dielectric layer, a charge-trap layer, a tunneling oxide layer, and an epitaxial silicon portion formed inside a substantially vertical opening created in a planar stack formed by alternate layers of electrically conductive and insulating material, wherein the charge-trap layer is in direct contact with a substantially vertical surface of the epitaxial silicon portion, the epitaxial silicon portion having a height extending from a top of the epitaxial silicon portion to a bottom of the epitaxial silicon portion, wherein the substantially vertical structure comprises the dielectric layer substantially covering a wall of the substantially vertical opening and the epitaxial silicon portion partially covered by the tunneling oxide layer and the charge-trap layer.

17. A system comprising:
    a processor; and a memory device coupled to the processor, the memory device comprising one or more charge-trap memory cells, some of the charge-trap memory cells comprising:

a substantially vertical structure including at least a dielectric layer, a charge-trap layer, a tunneling oxide layer, and an epitaxial silicon portion formed inside a substantially vertical opening created in a planar stack formed by alternate layers of electrically conductive and insulating material, wherein the charge-trap layer is in direct contact with a substantially vertical surface of the epitaxial silicon portion, the epitaxial silicon portion having a height extending from a top of the epitaxial silicon portion to a bottom of the epitaxial silicon portion, wherein the substantially vertical structure comprises the dielectric layer substantially covering a wall of the substantially vertical opening and the epitaxial silicon portion partially covered by the tunneling oxide layer and the charge-trap layer.

18. The system of claim 17, wherein the dielectric layer comprises an inter-poly dielectric (IPD) layer, and wherein the charge-trap layer comprises atomic layer deposited (ALD) silicon nitride.

19. The system of claim 17, wherein the substantially vertical structure includes the charge-trap layer filling a gap between the tunneling oxide layer and the dielectric layer.

* * * * *